(12) United States Patent
Labonte et al.

(10) Patent No.: US 11,380,581 B2
(45) Date of Patent: Jul. 5, 2022

(54) INTERCONNECT STRUCTURES OF SEMICONDUCTOR DEVICES HAVING A VIA STRUCTURE THROUGH AN UPPER CONDUCTIVE LINE

(71) Applicant: GLOBALFOUNDRIES U.S. INC., Santa Clara, CA (US)

(72) Inventors: Andre P. Labonte, Mechanicville, NY (US); Catherine B Labelle, Schenectady, NY (US); Chanro Park, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 128 days.

(21) Appl. No.: 16/185,015

(22) Filed: Nov. 9, 2018

(65) Prior Publication Data
US 2020/0152512 A1   May 14, 2020

(51) Int. Cl.
*H01L 21/768*   (2006.01)
*H01L 21/311*   (2006.01)
*H01L 23/528*   (2006.01)

(52) U.S. Cl.
CPC ...... *H01L 21/76879* (2013.01); *H01L 21/311* (2013.01); *H01L 23/528* (2013.01)

(58) Field of Classification Search
CPC . H01L 21/76879; H01L 21/311; H01L 23/528
See application file for complete search history.

(56) References Cited

U.S. PATENT DOCUMENTS

| | | | |
|---|---|---|---|
| 5,236,550 A | 8/1993 | Abt et al. | |
| 5,795,823 A | 8/1998 | Avanzino et al. | |
| 6,232,232 B1* | 5/2001 | Lee | C03C 15/00 |
| | | | 257/E21.251 |
| 7,112,528 B2 | 9/2006 | Chen et al. | |
| 7,696,085 B2* | 4/2010 | Li | H01L 21/0338 |
| | | | 438/626 |
| 8,432,040 B2* | 4/2013 | Yu | H01L 21/76807 |
| | | | 257/774 |
| 9,698,100 B2* | 7/2017 | Lu | H01L 21/76877 |
| 9,806,032 B1* | 10/2017 | Lin | H01L 23/544 |
| 9,831,124 B1* | 11/2017 | Zhang | H01L 23/5226 |
| 10,163,786 B2* | 12/2018 | Yang | H01L 23/53228 |
| 10,340,183 B1* | 7/2019 | Fang | H01L 21/76844 |
| 10,636,737 B2* | 4/2020 | Bao | H01L 21/02126 |
| 10,714,341 B2* | 7/2020 | Cohen | H01L 21/76877 |

(Continued)

OTHER PUBLICATIONS

Zhang et al., "Ruthenium Interconnect Resistivity and Reliability at 48 nm pitch", (c) 2016 IEEE (Year: 2016).*

(Continued)

*Primary Examiner* — Allen L Parker
*Assistant Examiner* — Wasiul Haider
(74) *Attorney, Agent, or Firm* — Anthony Canale

(57) ABSTRACT

A method of fabricating an interconnect structure of a semiconductor device is provided having a first conductive line and forming a second conductive line over the first conductive line. A via opening is formed in the second conductive line, and the via opening is aligned over the first conductive line. The via opening is filled with a conductive material to form an interconnect via and an upper portion of the interconnect via forms a portion of the second conductive line.

9 Claims, 14 Drawing Sheets

(56) References Cited

U.S. PATENT DOCUMENTS

| | | | |
|---|---|---|---|
| 10,777,735 B2* | 9/2020 | Yang | H01L 21/76816 |
| 2003/0060052 A1* | 3/2003 | Kim | H01L 28/55 |
| | | | 438/694 |
| 2003/0211727 A1* | 11/2003 | Chen | H01L 21/76808 |
| | | | 438/632 |
| 2004/0157435 A1 | 8/2004 | Park | |
| 2005/0093168 A1* | 5/2005 | Tsumura | H01L 21/76879 |
| | | | 257/774 |
| 2014/0183738 A1* | 7/2014 | Jezewski | H01L 23/485 |
| | | | 257/751 |
| 2016/0163587 A1* | 6/2016 | Backes | H01L 21/2885 |
| | | | 257/751 |
| 2016/0309596 A1* | 10/2016 | Shaviv | C25D 7/123 |
| 2018/0061768 A1* | 3/2018 | Edelstein | H01L 21/76882 |
| 2019/0189510 A1* | 6/2019 | Lin | H01L 21/76831 |
| 2019/0304919 A1* | 10/2019 | Zhu | H01L 23/53238 |
| 2019/0363048 A1* | 11/2019 | Zhao | H01L 21/76846 |
| 2020/0066630 A1* | 2/2020 | Bao | H01L 23/5283 |

OTHER PUBLICATIONS

Prof Saraswat, Interconnections: Aluminum Metallization, EE311, Spring 2003, pp. 1-25.

* cited by examiner

INTERCONNECT STRUCTURES OF SEMICONDUCTOR DEVICES HAVING A VIA STRUCTURE THROUGH AN UPPER CONDUCTIVE LINE

FIELD OF THE INVENTION

The disclosed subject matter relates generally to a method of fabricating semiconductor devices, and more particularly to a method of fabricating self-aligned interconnect vias of semiconductor devices and the resulting devices.

BACKGROUND

The ongoing progress in the semiconductor industry is continuing to lead to greater device miniaturization. Device miniaturization is enabled by increasing structure pattern density and enhancing functionality that effectively reduces the cost per chip. As the geometric limits of the semiconductor structures are pushed against process technology limits, the intrinsic properties of the conductive materials become more significant.

There are two conventional methods of fabricating interconnect structures: a single damascene integration scheme and a dual damascene integration scheme. The single damascene integration scheme involves forming an interconnect via before forming a conductive line over the interconnect via. The interconnect via is formed by filling a via opening in a dielectric layer. The conductive line is formed from a layer of conductive material that is etched using conventional plasma etching process. As the interconnect via formed before the conductive line, this integration scheme does not self-align the interconnect via to the above conductive line. As the geometric features continue to shrink, the ability to fully align the conductive line over the interconnect via becomes significantly challenging. Misalignment of the interconnect via and the conductive line will compromise the electrical performance and the reliability of the interconnect structure. The typical conductive material used in a single damascene integration scheme is aluminum (Al).

The dual damascene integration scheme involves defining a via opening below a trench in a dielectric layer before filling with a conductive material to form a interconnect via and a conductive line concurrently. This integration scheme self-aligns the formed interconnect via to the above conductive line. The surface of the conductive line is subsequently planarized using conventional chemical mechanical planarization (CMP) process. The self-alignment of an interconnect via to an above conductive line is a desired integration scheme. The typical conductive material used in a dual damascene integration scheme is copper (Cu).

The use of Cu provides several advantages as an interconnect material for semiconductor devices over Al. Cu reduces interconnect propagation delays, reduces cross-talk and enables higher interconnect density. For instance, using Cu as an interconnect material allows a reduction in interconnect stack height thereby reduces signal cross-talk and improves interconnect speed due to its lower resistivity as compared to Al.

However, using Cu has several technical challenges; for example, poor adherence to dielectric materials, electromigration of Cu material during device use and its poor recess filling properties that may result in voids. The associated requirement of an etch stop layer and a diffusion barrier layer at each Cu conductive level has resulted in process integration becoming increasing more complicated.

With the shrinking of geometric features, an increasing fraction of the total conductive line volume has been attributed to the presence of the diffusion barrier layer and the diffusion barrier layer contributes an undesirable higher resistance to the conductive line.

As described above, there is a strong need to identify alternative conductive materials that can overcome the technical challenges of Cu and to provide a fabrication method of self-aligning interconnect vias.

SUMMARY

To achieve the foregoing and other aspects of the present disclosure, a method to fabricate interconnect structures of semiconductor devices is presented.

According to an aspect of the present disclosure, a method of fabricating an interconnect structure of a semiconductor device is provided having a first conductive line and forming a second conductive line over the first conductive line. A via opening is formed in the second conductive line, and the via opening is aligned over the first conductive line. The via opening is filled with a conductive material to form an interconnect via, and an upper portion of the interconnect via forms a portion of the second conductive line.

According to another aspect of the present disclosure, a semiconductor device is provided that includes a first conductive line, a dielectric layer, a second conductive line and an interconnect via. The dielectric layer is formed over the first conductive line and the second conductive layer is formed over the dielectric layer. The interconnect via connects the first conductive line and the second conductive line, and an upper portion of the interconnect via forms a portion of the second conductive line.

According to yet another aspect of the present disclosure, a semiconductor device is provided that includes a first conductive line, a first dielectric layer, an etch stop layer, a second dielectric layer, a second conductive line, a third dielectric layer and an interconnect via. The first conductive line is interposed in the first dielectric layer and the etch stop layer is formed over the first conductive line and the first dielectric layer. The second dielectric layer is formed over the etch stop layer. The second conductive line is formed over the second dielectric layer, wherein the second conductive line is interposed in the third dielectric layer, forming an interconnect layer. The interconnect via connects the first conductive line and the second conductive line, and an upper portion of the interconnect via forms a portion of the second conductive line.

BRIEF DESCRIPTION OF THE DRAWINGS

The embodiments of the present disclosure will be better understood from a reading of the following detailed description, taken in conjunction with the accompanying drawings.

Figure 1:
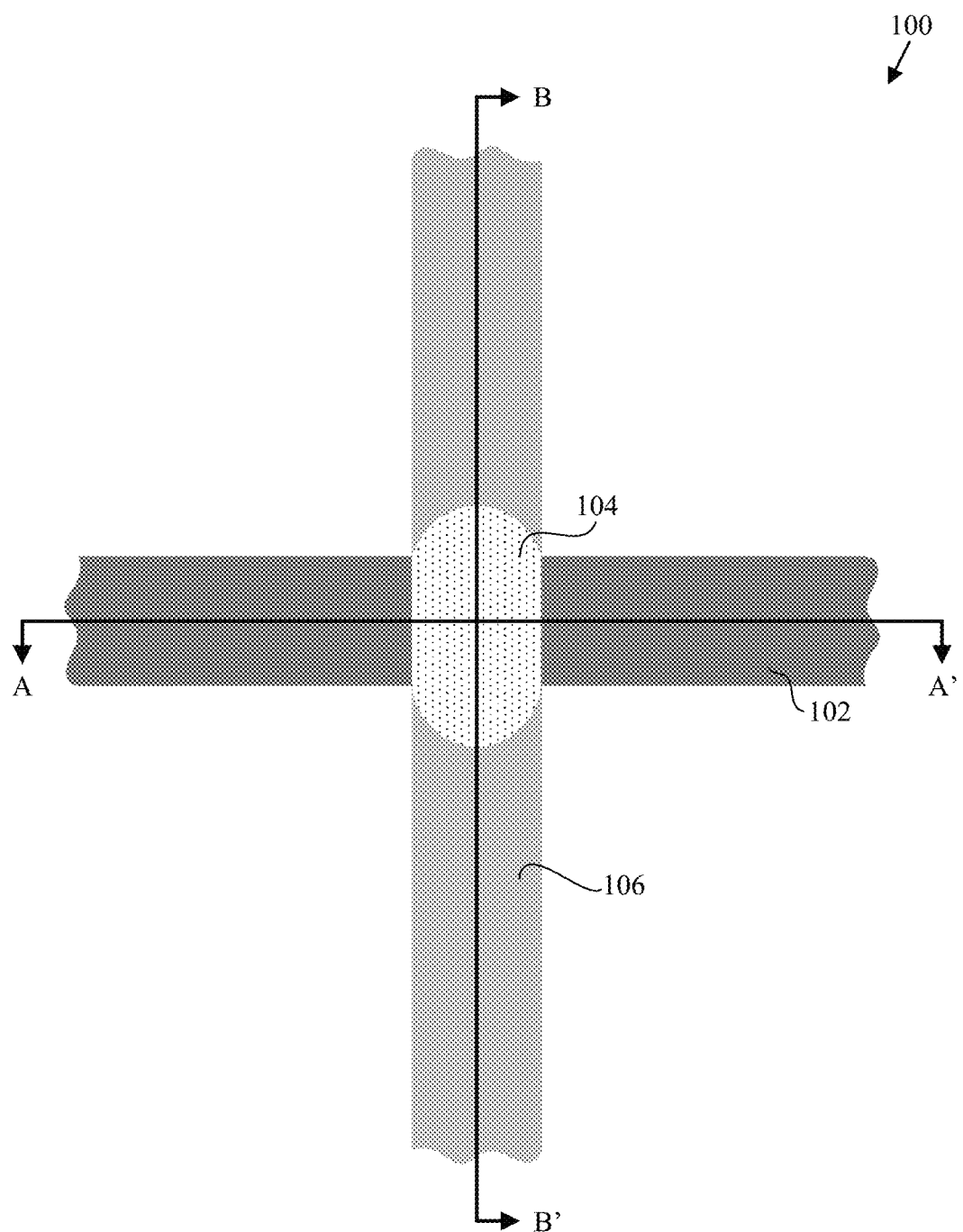
FIG. 1 is a top view of an interconnect structure of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

The present disclosure relates to a method of fabricating self-aligned interconnect structures of semiconductor devices. Aspects of the present disclosure are now described in detail with accompanying drawings. It is noted that like and corresponding elements are referred to by the use of the same reference numerals.

FIG. 1 is a top view of a semiconductor device 100, according to an embodiment of the present disclosure. More specifically, with reference to FIG. 1, the semiconductor device 100 includes a first conductive line 102, an interconnect via 104 and a second conductive line 106. In this embodiment, the second conductive line 106 is formed perpendicularly over the first conductive line 102. The interconnect via 104 connects the first conductive line 102 to the second conductive line 106, and an upper portion of the interconnect via 104 forms a portion of the second conductive line 106. Semiconductor components, such as transistors, capacitors and resistors are not shown for clarity.

FIGS. 2A-7B are cross-sectional views of a semiconductor device 200 taken along lines A-A' and B-B' as indicated in FIG. 1 of the semiconductor device 100, according to an embodiment of the disclosure. The CMP process is a necessary process step for the conventional dual damascene integration scheme of interconnect structures. However, some conductive materials, for example, Al and Ru, are difficult to remove using conventional CMP process due to their slow removal rate. As a result, highly abrasive slurries are required to get an appreciable CMP removal rate, which in turn may result in a higher defect rate post-CMP process; for example, scratches and/or surface particles. Additionally, costly cleaning chemistries are required for post-CMP cleaning. FIGS. 2A-7B illustrate the method of fabricating a self-aligned interconnect structure of a semiconductor device with a conductive material that may be challenging to remove by conventional CMP process.

Figure 2A:
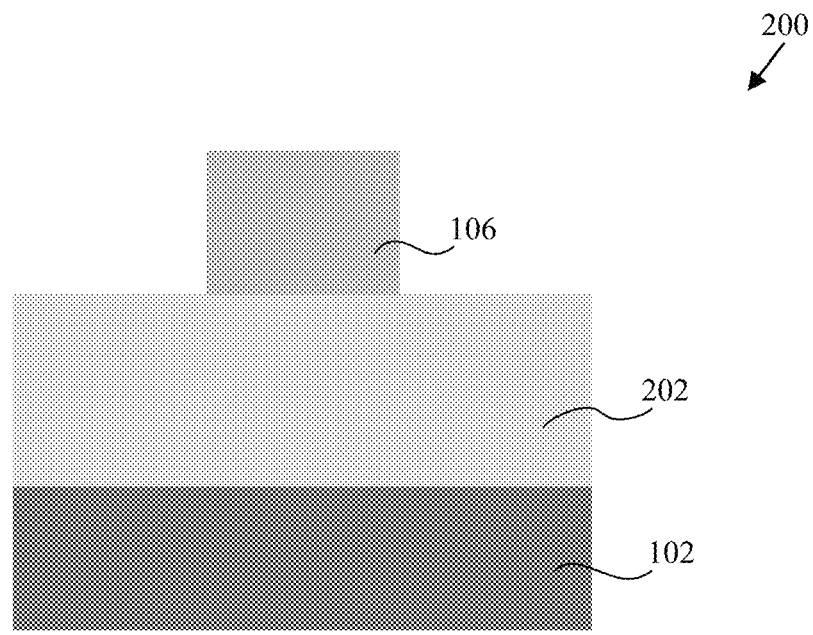
FIGS. 2A-7B are cross-sectional views of a semiconductor device (taken along lines A-A' and B-B' as indicated in FIG. 1), depicting a method of fabricating interconnect structures, according to an embodiment of the disclosure.
Figure 2B:
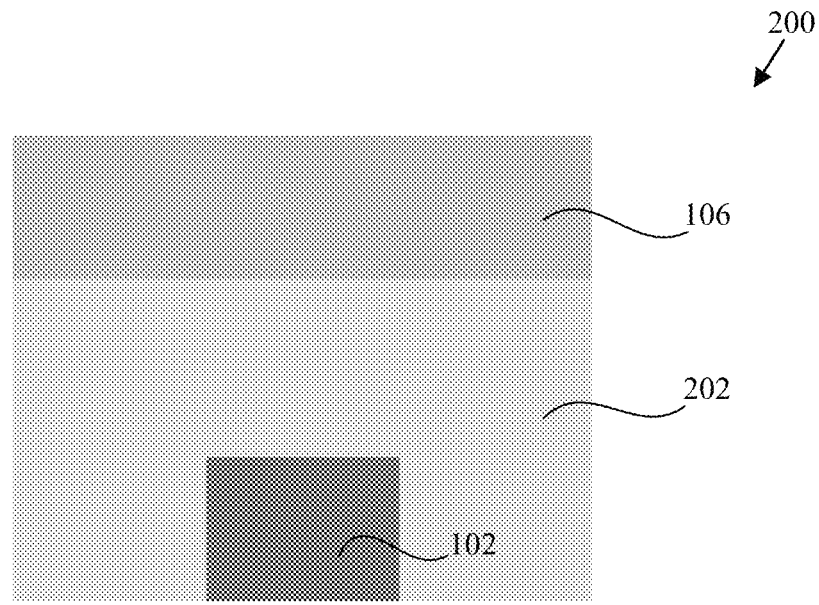

FIGS. 2A and 2B are cross-sectional views of the semiconductor device 200, taken along lines A-A' and B-B', respectively, as indicated in FIG. 1. As illustrated in FIG. 2B, the semiconductor device 200 includes the first conductive line 102 in a first dielectric layer 202 and the second conductive line 106 over the first dielectric layer 202. The fabrication of the first conductive line 102 in the first dielectric layer 202 may be a one or a multi-step process, depending on the integration scheme adopted. A layer of conductive material is deposited over the first dielectric layer 202 and the second conductive line 106 is formed by conventional photolithographic and plasma etching processes of the layer of conductive material. In one embodiment of the disclosure, the first dielectric layer 202 is formed from a dielectric material with an ultra-low dielectric constant.

The conductive material used to form the first conductive line 102 comprises Al, Cu, ruthenium (Ru), tungsten (W), cobalt (Co) or other conductive materials. The conductive material used to form the second conductive line 106 includes titanium (Ti), titanium nitride (TiN), Ru, Co, Al, W or other conductive materials that can be selectively removed by conventional plasma etching process.

Ruthenium (Ru) and cobalt (Co) are alternative conductive materials that may be suitable to replace Cu as an interconnect material. Both conductive materials have lower electrical resistance and higher resistivity to electro-migration that enable fabrication of high performance interconnect structures. Other preferable qualities present in both Ru and Co include having a shorter mean free length than Cu that provides a more desirable gap fill property and do not require diffusion barrier layers which are otherwise used to prevent electro-migration of Cu material. In one embodiment of the disclosure, the preferred conductive material to form the second conductive line 106 is Ru.

Figure 3A:
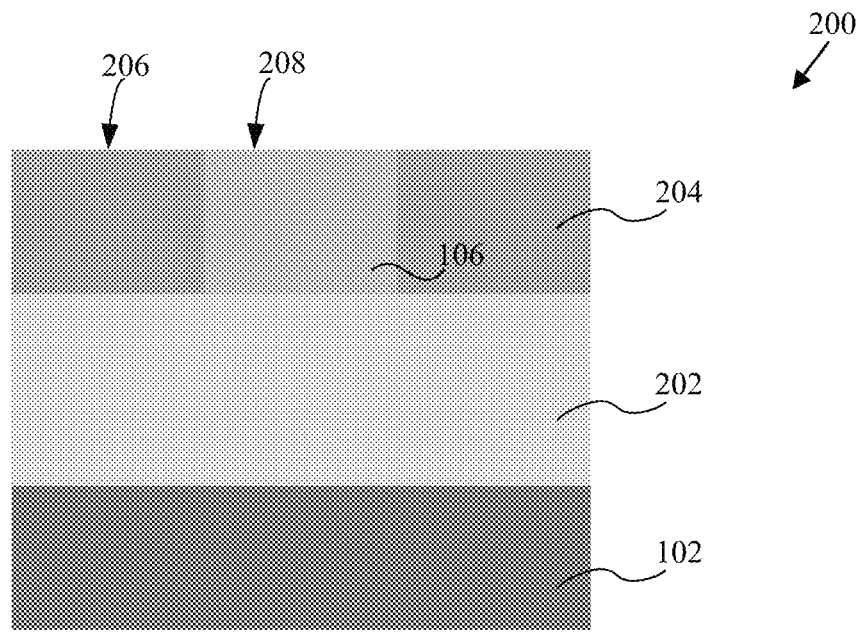
Figure 3B:
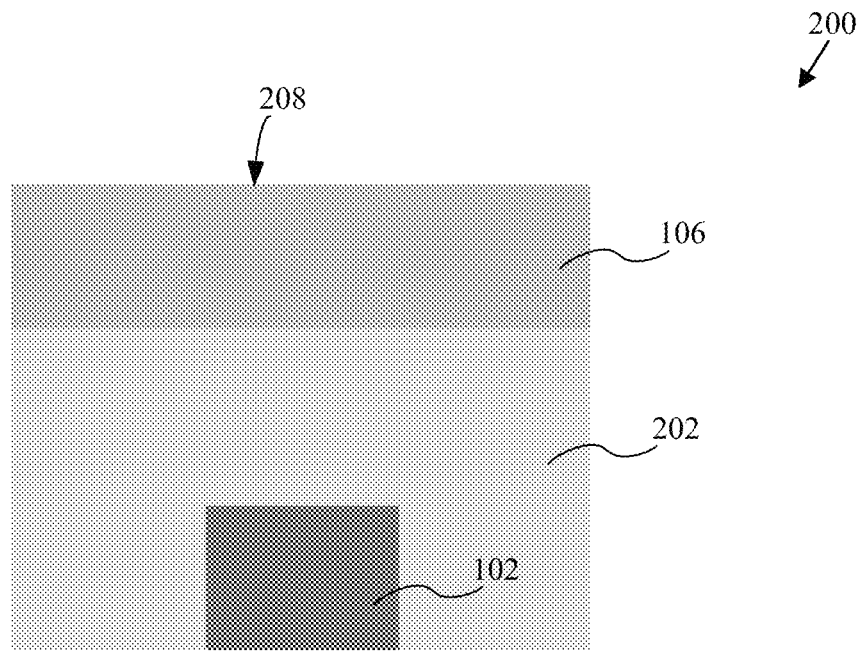

FIGS. 3A and 3B are cross-sectional views of the semiconductor device 200 after depositing a second dielectric layer 204, taken along lines A-A' and B-B', respectively, as indicated in FIG. 1. The second dielectric layer 204 is deposited over the first dielectric layer 202 and over the second conductive line 106. The second dielectric layer 204 is subsequently planarized (for instance: using conventional CMP process) to form an upper surface 206 coplanar with an upper surface 208 of the second conductive line 106. The second dielectric layer 204 may be a sacrificial material or a non-sacrificial material.

In one embodiment of the disclosure, the second dielectric layer 204 as the sacrificial material is preferred to be tetraethylorthosilicate (TEOS), silicon nitride (SiN), silicon carbide (SiC) or spin-on-glass (SOG) belonging to a polysilazane-family material layer containing a plurality of Si—NxHy combinations, wherein x and y are in stoichiometric ratio. If the second dielectric layer 204 used is a sacrificial material, the second dielectric layer 204 needs to be replaced with a non-sacrificial dielectric material after forming the interconnect via 104 and the "replacement" second dielectric layer 204 may be a dielectric material with an ultra-low dielectric constant.

Figure 4A:
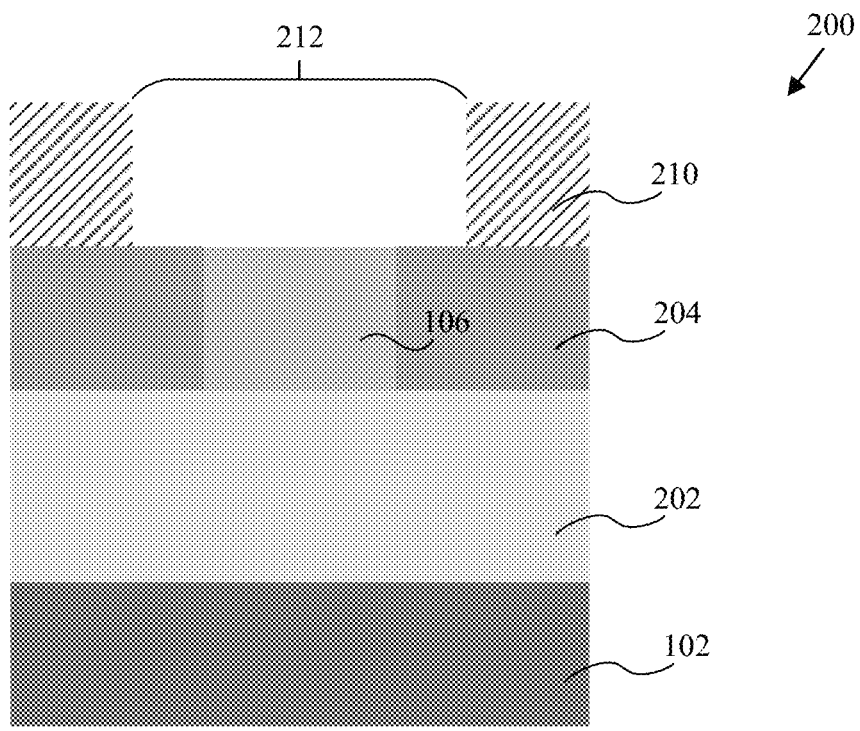
Figure 4B:
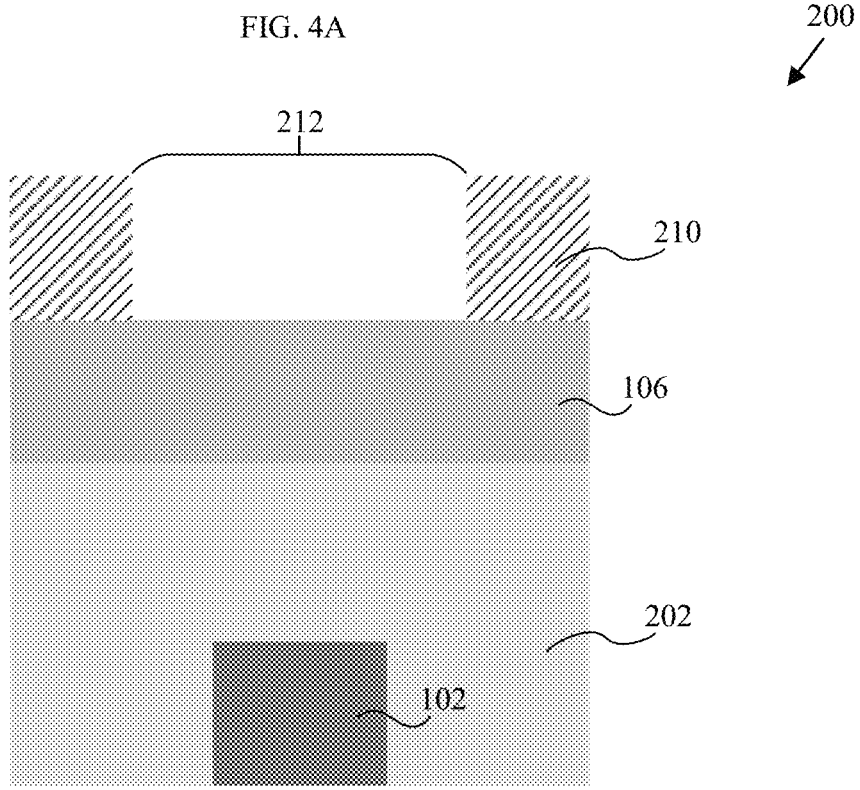

FIGS. 4A and 4B are cross-sectional views of the semiconductor device 200 after depositing and patterning a layer of photosensitive material 210, taken along lines A-A' and B-B', respectively, as indicated in FIG. 1. The layer of photosensitive material 210 (or more complex patterning stack as needed) is deposited over the second dielectric layer 204 and the second conductive line 106. An opening 212 is formed in the layer of photosensitive material 210, aligned to the first and the second conductive lines (102 and 106, respectively). The opening 212 may have a wider width or a same width as the first conductive line 102. A portion of the second conductive line 106 and a portion of the second dielectric layer 204 are exposed in the opening 212. In one embodiment of the disclosure, the opening 212 is preferred to have a wider width than a width of the first conductive line 102, as it is an objective of this disclosure to fabricate an interconnect via that fully aligns to and fully contacts the first conductive line 102.

Figure 5A:
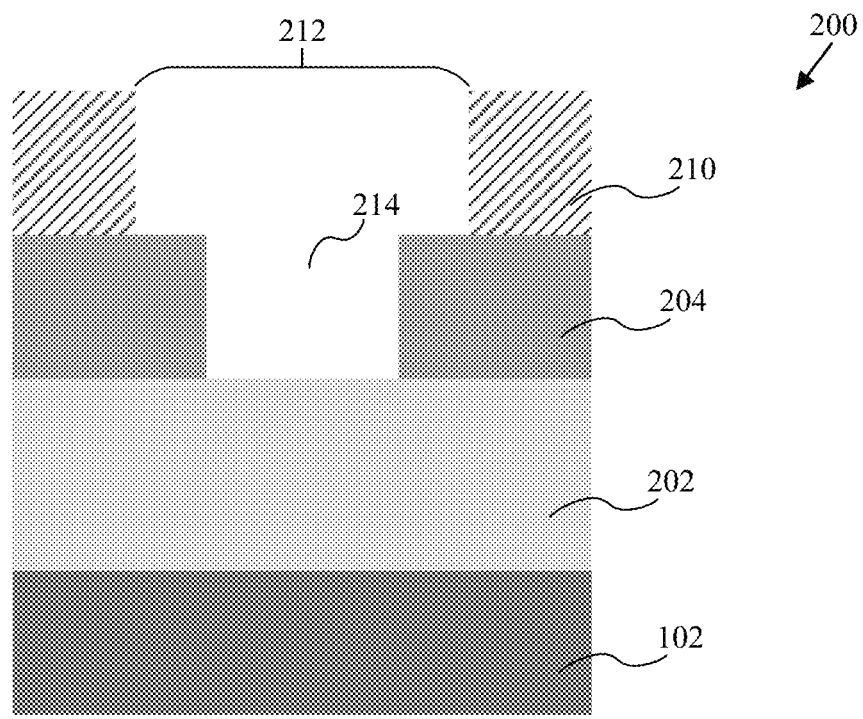
Figure 5B:
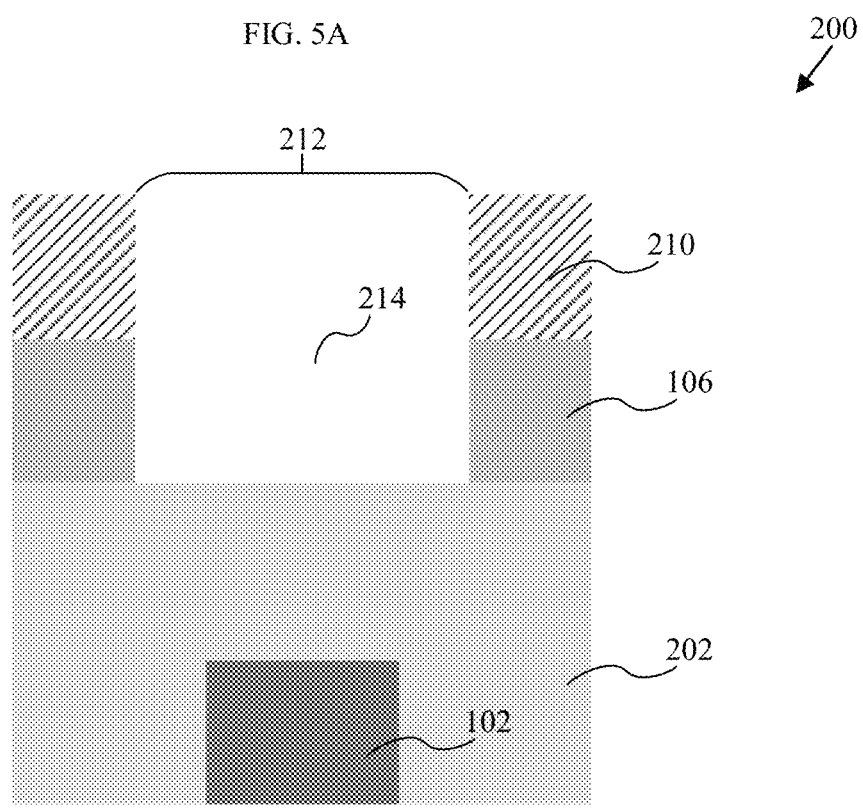

FIGS. 5A and 5B are cross-sectional views of the semiconductor device 200 after selectively removing the exposed portion of the second conductive line 106, taken along lines A-A' and B-B', respectively, as indicated in FIG. 1. The exposed portion of the second conductive line 106 is etched using conventional plasma etching process to form a via opening 214. A portion of the first dielectric layer 202 is exposed in the via opening 214. As illustrated in FIG. 5A, the opening 212 has a width wider than the via opening 214 along the line A-A'. As illustrated in FIG. 5B, the opening 212 has a same width as the via opening 214 along the line B-B.

Figure 6A:
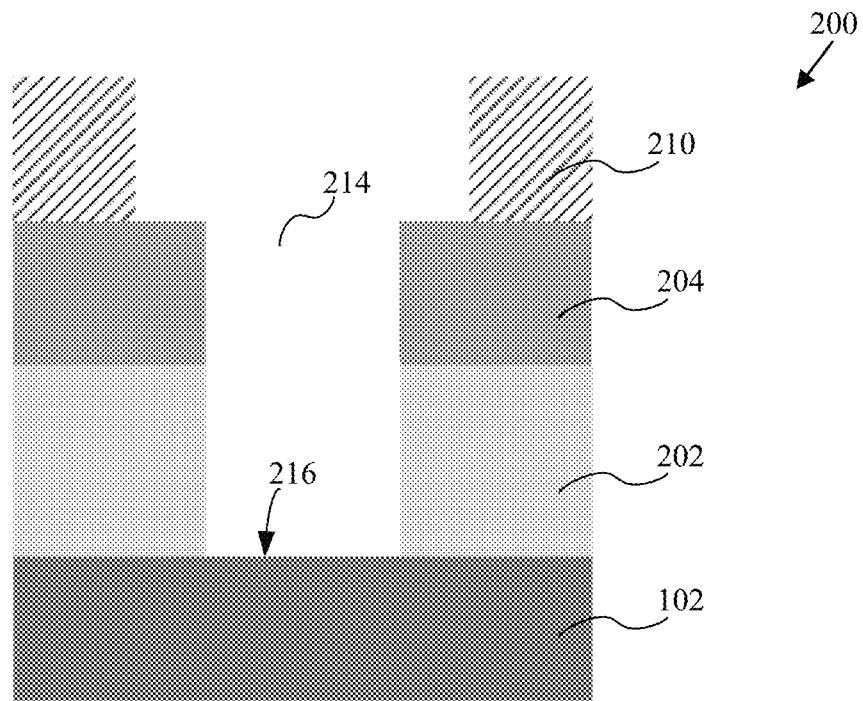
Figure 6B:
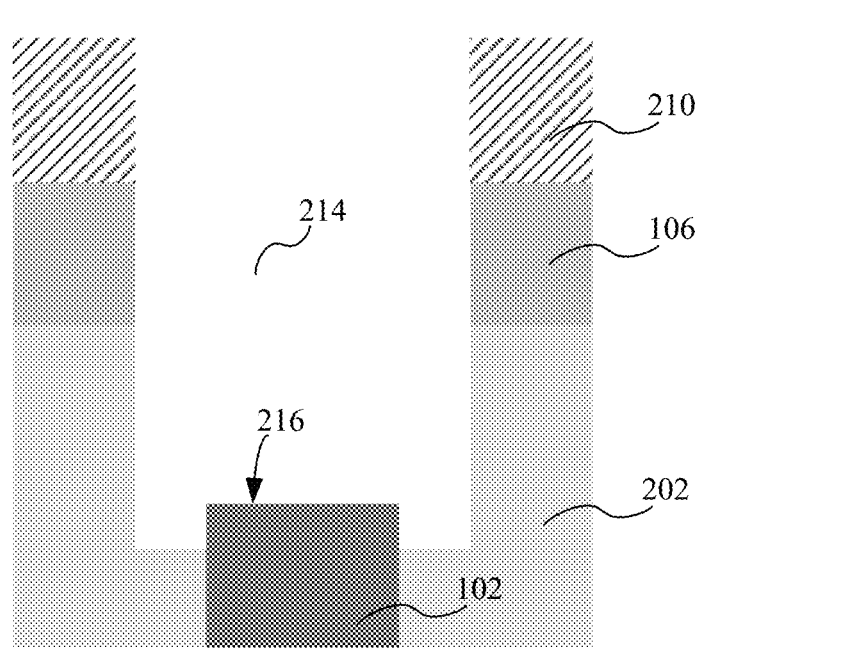

FIGS. 6A and 6B are cross-sectional views of the semiconductor device 200 after selectively removing the exposed portion of the first dielectric layer 202, taken along lines A-A' and B-B', respectively, as indicated in FIG. 1. The exposed portion of the first dielectric layer 202 is removed using conventional plasma etching process, extending the via opening 214 through the first dielectric layer 202 to an upper surface 216 of the first conductive line 102. It is preferred to have a high etch selectivity between the first dielectric layer 202 and the second dielectric layer 204 to sufficiently preserve the exposed portion of the second dielectric layer 204 during the plasma etching process.

As illustrated in FIG. 6B, during the removal step, the first dielectric layer 202 has been removed from both sides of the first conductive line 102 to a level below the upper surface 216 of the first conductive line 102. This removal of additional material from the first dielectric layer 202 is to ensure the interconnect via is fully connected to the first conductive line 102. In one embodiment of the disclosure, the first dielectric layer 202 has been removed to a level that is less than 10 nm below the upper surface 216 of the first conductive line 102.

Figure 7A:
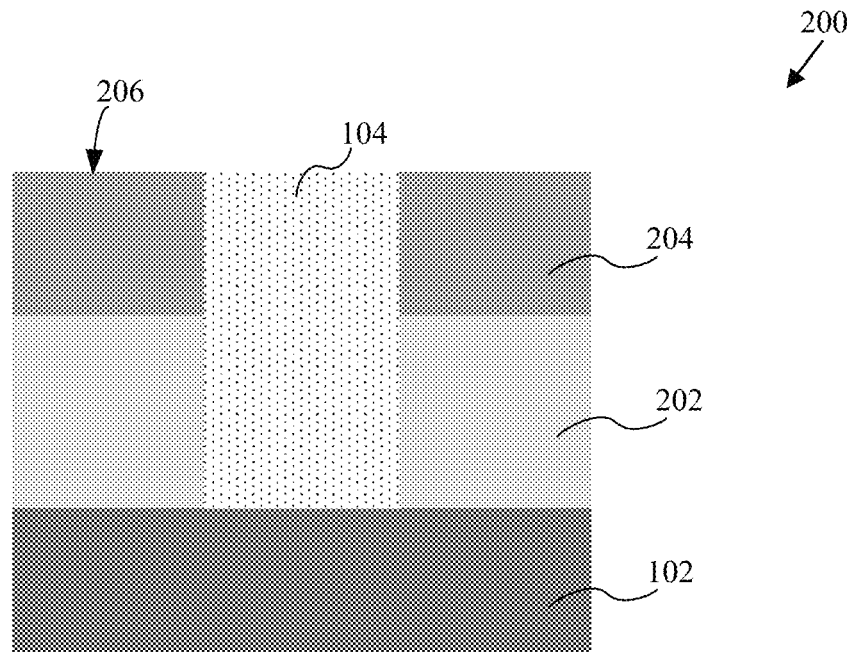
Figure 7B:
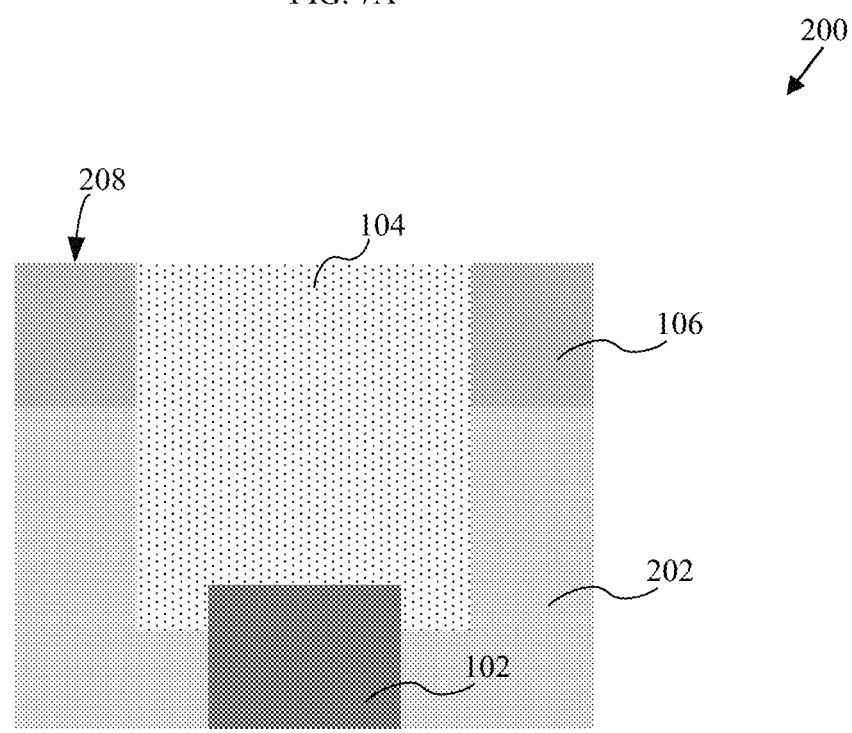

FIGS. 7A and 7B are cross-sectional views of the semiconductor device 200 after filling the via opening 214 with a conductive material, taken along lines A-A' and B-B', respectively, as indicated in FIG. 1. The via opening 214 is filled with the conductive material using conventional deposition process to the upper surface 208 of the second conductive line 106 to form the interconnect via 104. An upper portion of the interconnect via 104 fills the via opening in the second conductive line, thereby forming a portion of the second conductive line 106. The second conductive line 106 and the second dielectric layer 204 forms an interconnect layer, as illustrated in FIG. 7B. The conductive material may overfill the via opening 214, and the overfill may be removed using conventional CMP process to form a planar surface with the upper surface 208 of the second conductive line 106.

In one embodiment of the disclosure, the conductive material is preferred to be a material that is suitable for CMP process and the material includes W, Cu or Co. In another embodiment of the disclosure, the preferred material to form the interconnect via 104 is Co. In yet another embodiment, the interconnect via 104 is filled with the same conductive material as the second conductive line 106, and after forming the interconnect via 104, an anneal process is performed. The anneal process eliminates the interface between the upper portion of the interconnect via 104 and the second conductive line 106, improving electrical resistance of the second conductive line 106.

FIGS. 8A-14B are cross-sectional views of a semiconductor device 800 taken along lines A-A' and B-B', respectively, as indicated in FIG. 1. FIGS. 8A-14B illustrate a method of fabricating a fully self-aligned interconnect structure of a semiconductor device with a conductive material that may be challenging to remove by conventional CMP process. Certain structures may be conventionally fabricated, for example, using known processes and techniques and specifically disclosed processes and methods may be used to achieve individual aspects of the present disclosure.

Figure 8A:
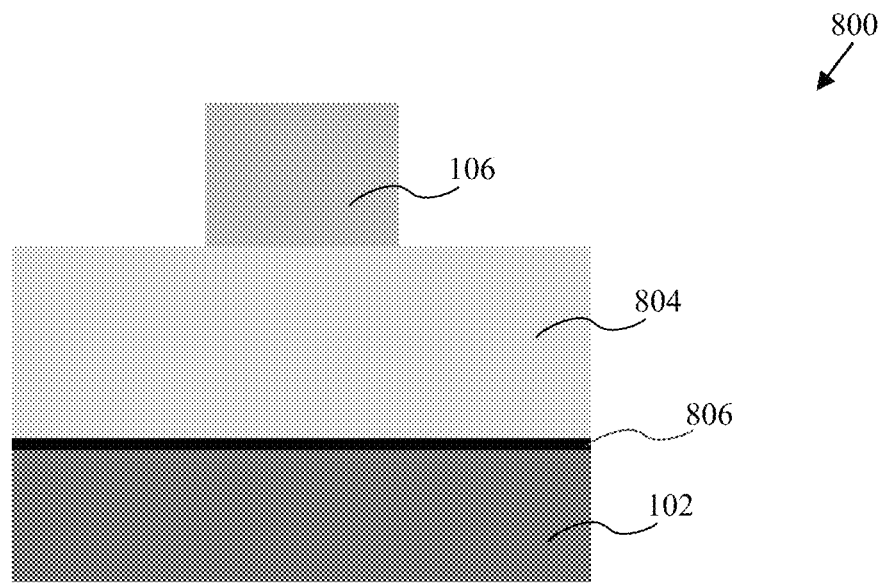
FIGS. 8A-14B are cross-sectional views of a semiconductor device (taken along lines A-A' and B-B' as indicated in FIG. 1), depicting a method of fabricating interconnect structures, according to another embodiment of the disclosure.
Figure 8B:
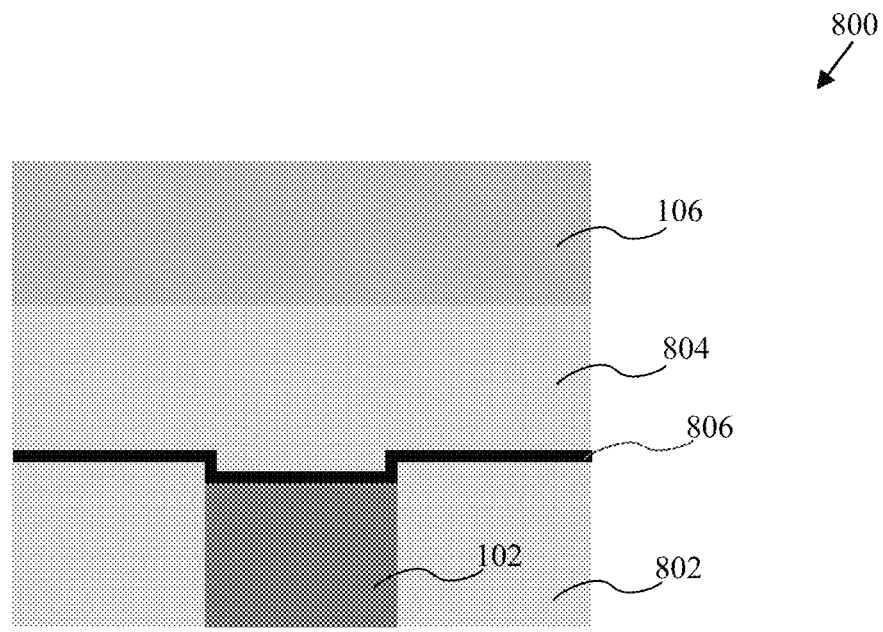

FIGS. 8A and 8B are cross-sectional views of the semiconductor device 800, taken along lines A-A' and B-B', respectively, as indicated in FIG. 1. As illustrated in FIG. 8B, the semiconductor device 800 includes the first conductive line 102, a first dielectric layer 802, a second dielectric layer 804, an etch stop layer 806 and the second conductive line 106. The first conductive line 102 is formed in the first dielectric layer 802 and is recessed to a level below the first dielectric layer 802, as illustrated in FIG. 8B. In one embodiment of the disclosure, the first and second dielectric layers (802 and 804, respectively) may be formed of the same or different dielectric material with an ultra-low dielectric constant. The first conductive line 102 is recessed to a level that is less than 10 nm below the first dielectric layer 802.

The etch stop layer 806 is deposited conformally over the first dielectric layer 802 and over the first conductive line 102. The second dielectric layer 804 is deposited over the etch stop layer 806. The etch stop layer 806 and the second dielectric layer 804 are deposited using conventional deposition process. The detailed description of forming the second conductive line 106 has been described in FIGS. 2A and 2B.

Figure 9A:
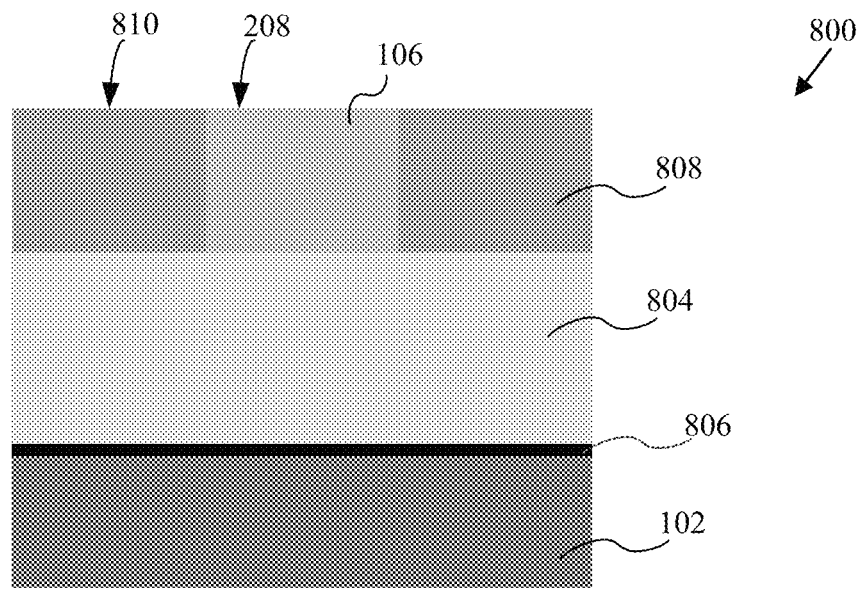
Figure 9B:
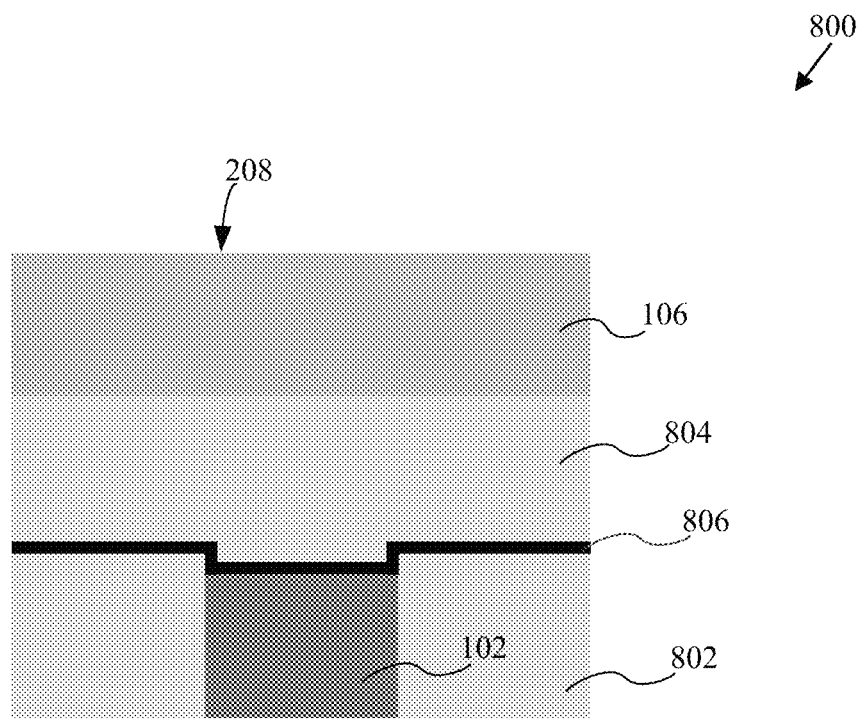
Figure 10A:
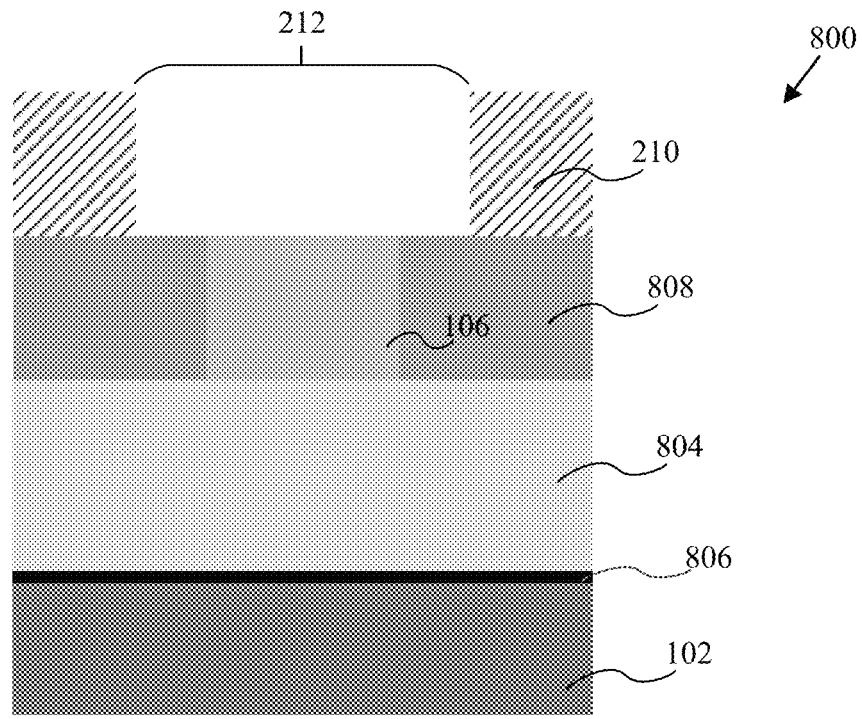
Figure 10B:
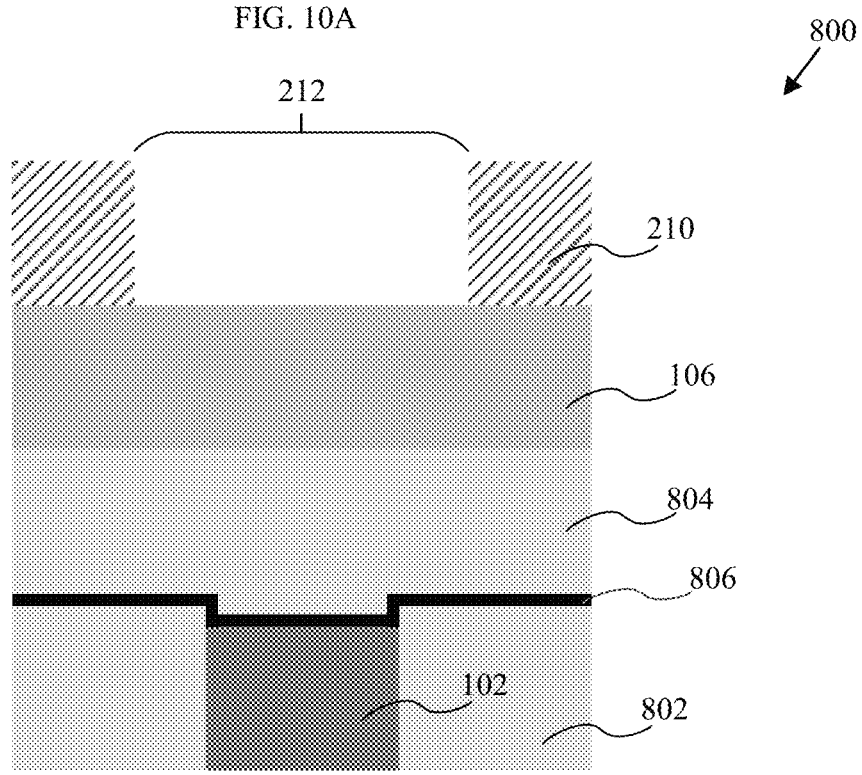

FIGS. 9A and 9B are cross-sectional views of the semiconductor device 800 after depositing a third dielectric layer 808, taken along lines A-A' and B-B', respectively, as indicated in FIG. 1. The third dielectric layer 808 is deposited over the second dielectric layer 804 and over the second conductive line 106. The third dielectric layer 808 is subsequently planarized (for instance: using conventional CMP) process to form an upper surface 810 coplanar with the upper surface 208 of the second conductive line 106.

Similar to the second dielectric layer 204, the third dielectric layer 808 may be a sacrificial material or a non-sacrificial material. In one embodiment of the disclosure, the third dielectric layer 808 as the sacrificial material is preferred to be tetraethylorthosilicate (TEOS), silicon nitride (SiN), silicon carbide (SiC) or spin-on-glass (SOG) belonging to a polysilazane-family material layer containing a plurality of Si—NxHy combinations, wherein x and y are in stoichiometric ratio. The third dielectric layer 808 as the non-sacrificial material may be a dielectric material with an ultra-low dielectric constant.

Figure 11A:
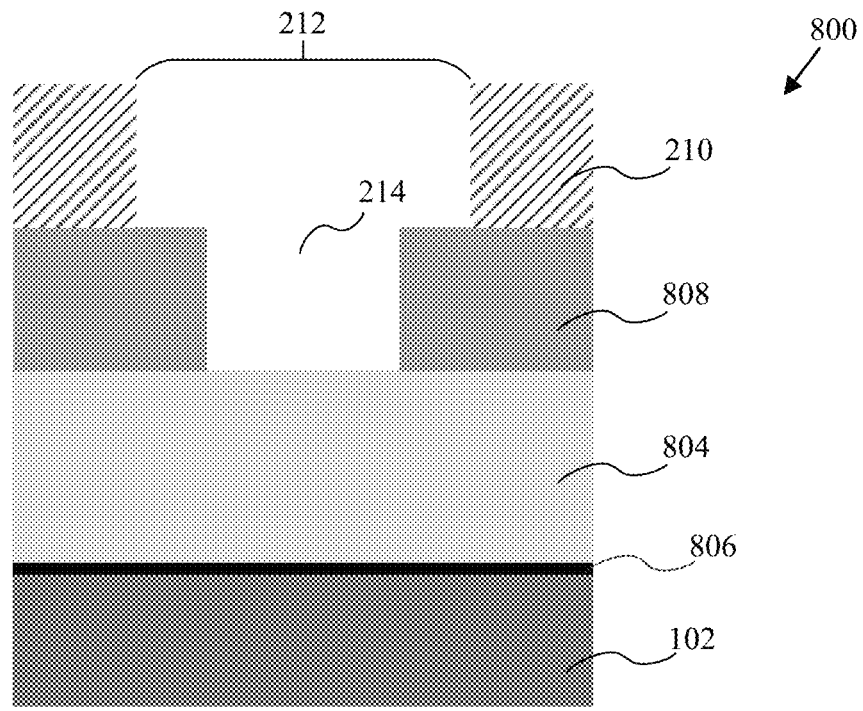
Figure 11B:
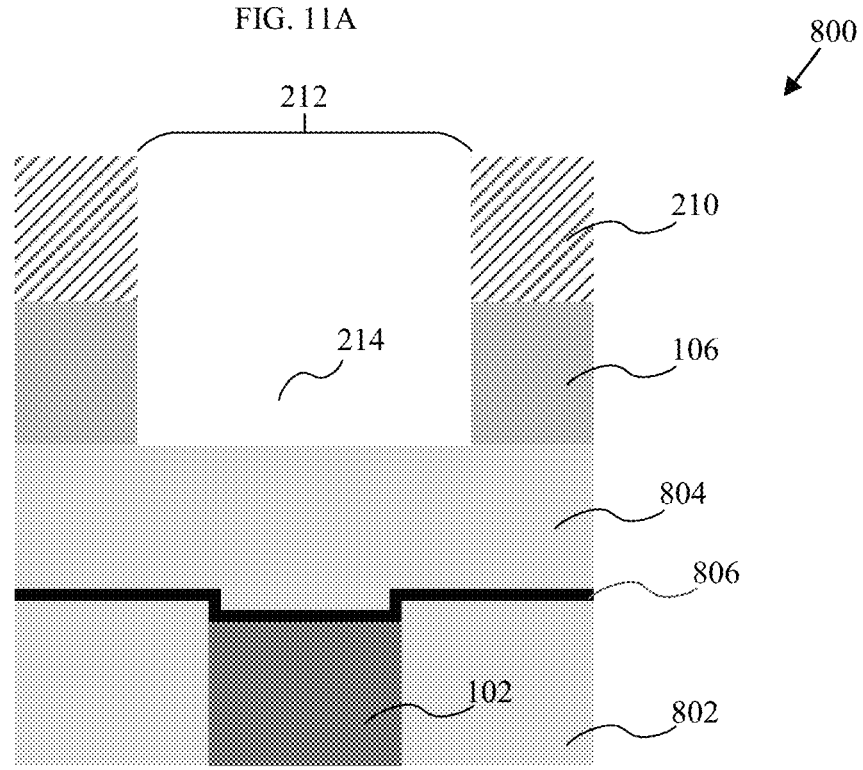

FIGS. 10A to 11B are cross-sectional views of the semiconductor device 800, taken along lines A-A' and B-B', respectively, as indicated in FIG. 1. FIGS. 10A to 11B depict the process steps of depositing a layer of photosensitive material 210 (or more complex patterning stack as needed) over the third dielectric layer 808 to define the opening 212 and etching the second conductive line 106 to form the via opening 214. The opening 212 may have a wider width or a same width as the first conductive line 102. In one embodiment of the disclosure, the opening 212 is preferred to have a wider width than the width of the first conductive line 102 as illustrated in FIG. 11B. The detailed description to the above process steps have been similarly described in FIGS. 4A to 5B.

Figure 12A:
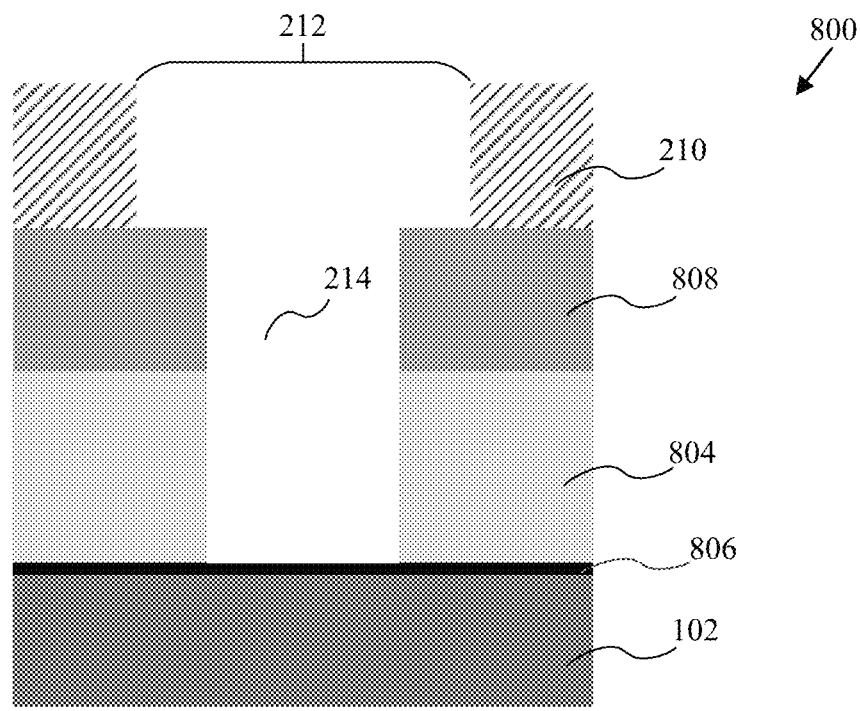
Figure 12B:
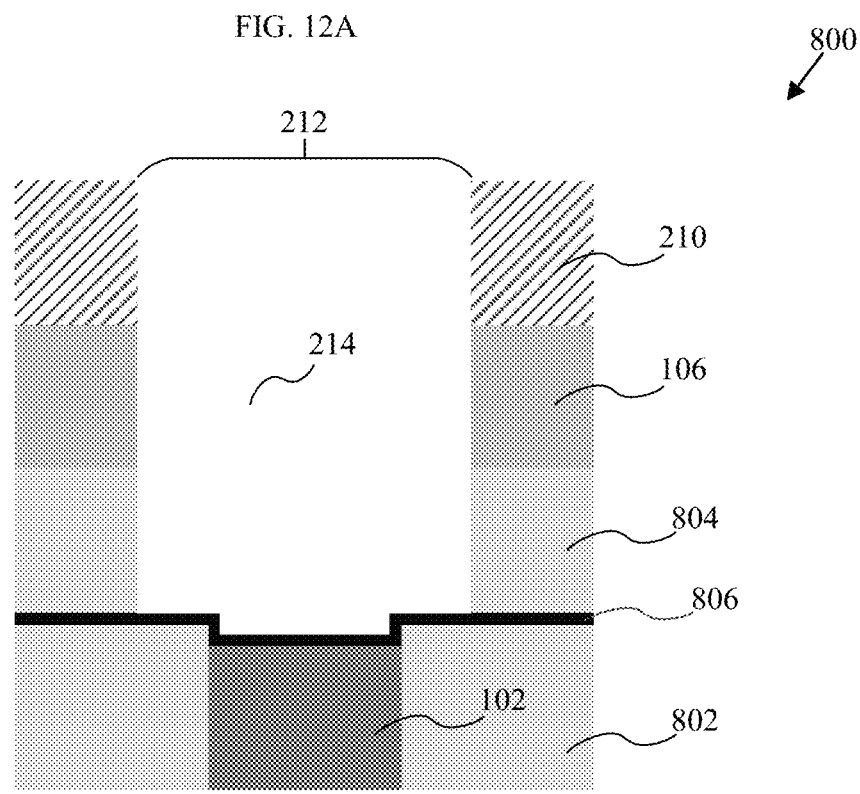

FIGS. 12A and 12B are cross-sectional views of the semiconductor device 800 after selectively removing exposed portion of the second dielectric layer 804 in the opening 212, taken along lines A-A' and B-B', respectively, as indicated in FIG. 1. The process step is similar to the process step described in FIGS. 6A and 6B. The via opening 214 is extended through the second dielectric layer 804 to the etch stop layer 806, exposing a portion of the etch stop layer 806. It is preferred to have a high etch selectivity between the second dielectric layer 804 and the third dielectric layer 808 to sufficiently preserve the exposed portion of the third dielectric layer 808 during the plasma etching process.

Figure 13A:
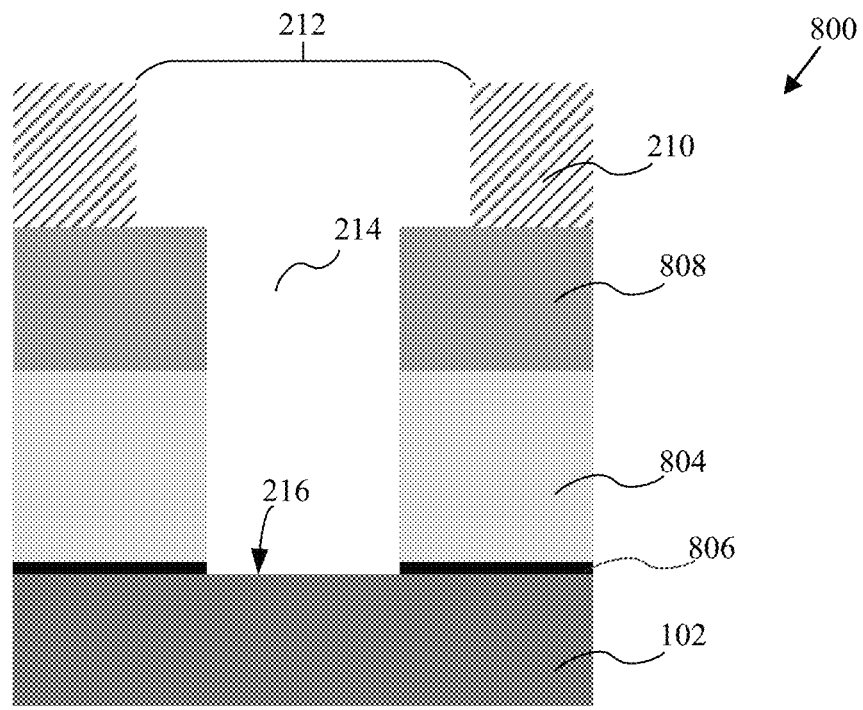
Figure 13B:
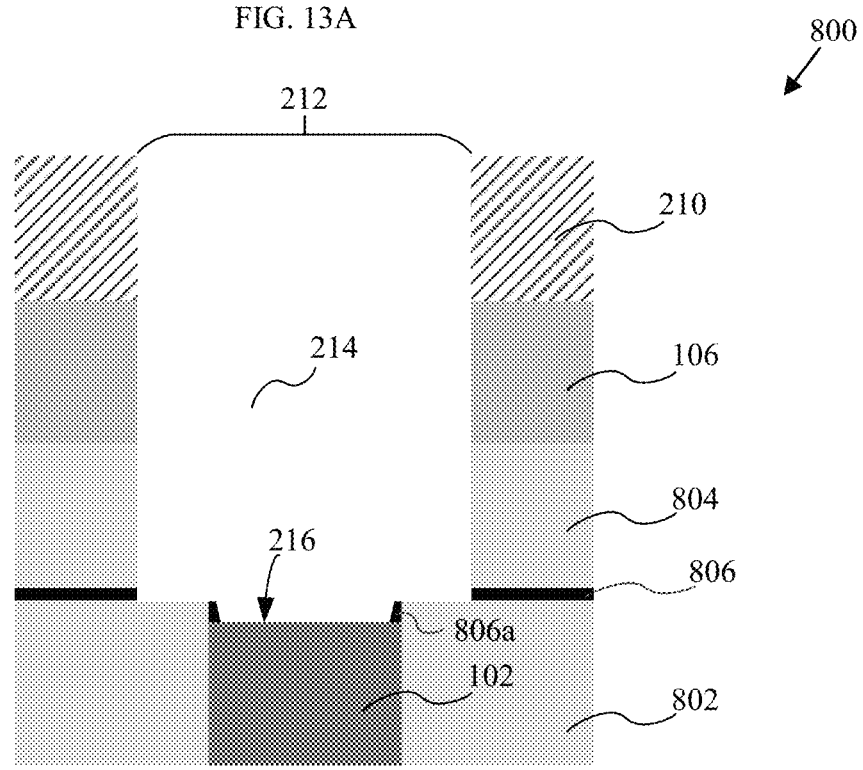

FIGS. 13A and 13B are cross-sectional views of the semiconductor device 800 after selectively removing the exposed portion of the etch stop layer 806, taken along lines A-A' and B-B', respectively, as indicated in FIG. 1. The exposed portion of the etch stop layer 806 is removed using conventional anisotropic plasma etching process. Due to the intrinsic nature of the anisotropic plasma etching process, the exposed etch stop layer 806 is removed on horizontal surfaces, exposing a portion of the first dielectric layer 802. A portion of the exposed etch stop layer 806a is left remaining on the first conductive line 102. The via opening 214 is extended through the etch stop layer 806 to the upper surface 216 of the first conductive line 102.

The exposed etch stop 806 layer may also be removed using conventional wet strip process, such that the exposed etch stop layer 806 is removed completely. One of the disadvantage of using conventional wet strip process is the isotropic nature of the wet strip process, i.e., the rate of removal of the etch stop layer 806 is the same in all directions, including the possibility of removing unexposed etch stop layer 806 positioned in between the first dielectric layer 802 and the second dielectric layer 804, adjacent to the exposed portion of the etch stop layer 806.

Figure 14A:
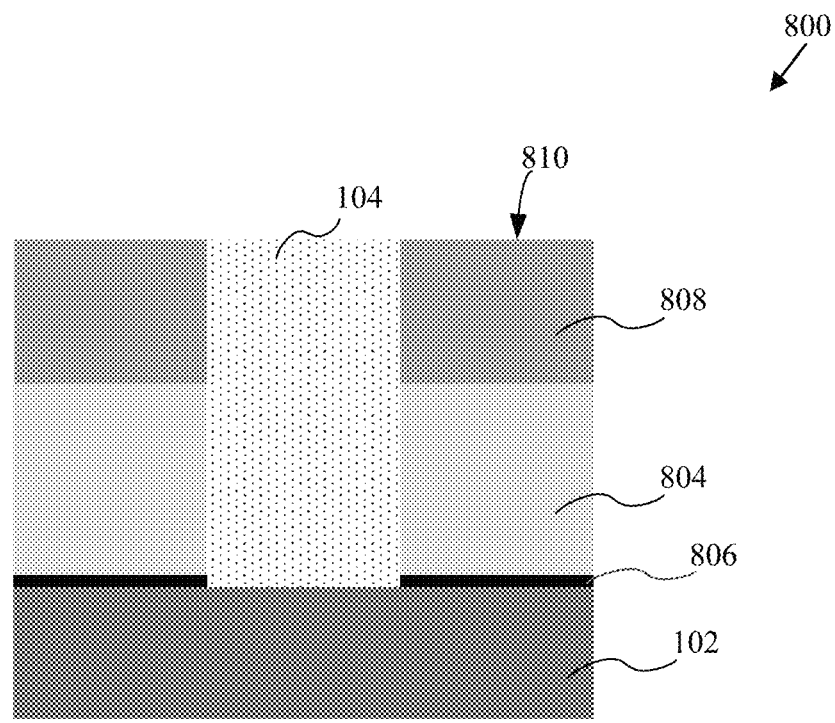
Figure 14B:
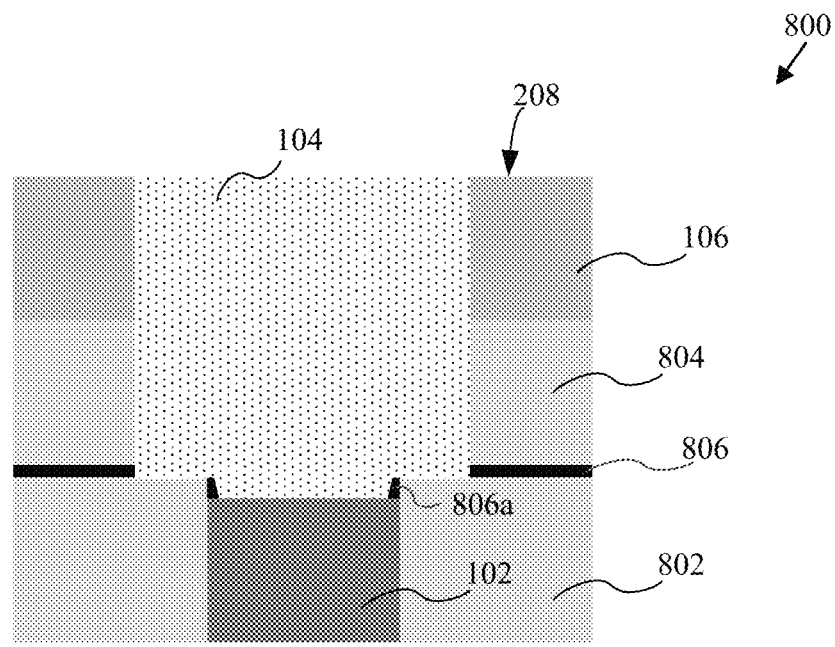

FIGS. 14A and 14B are cross-sectional views of the semiconductor device 800 after filling the via opening 214 with a conductive material, taken along lines A-A' and B-B', respectively, as indicated in FIG. 1. The via opening 214 is filled with the conductive material using conventional deposition process to the upper surface 208 of the second conductive line 106 to form the interconnect via 104. An upper portion of the interconnect via 104 fills the via opening 104 in the second conductive line 106, thereby forming a portion of the second conductive line 106. The second conductive line 106 and the third dielectric layer 808 forms an interconnect layer, as illustrated in FIG. 14B.

Similarly, as described in reference to FIGS. 7A and 7B, the deposition of the conductive material may overfill the via opening 214, and the overfill can be removed using conventional CMP process. In one embodiment of the disclosure, the conductive material is preferred to be a material that is suitable for CMP process and the material includes W, Cu or Co. In another embodiment of the disclosure, the preferred material to form the interconnect via 104 is Co. In yet another embodiment, the interconnect via 104 is filled with the same conductive material as the second conductive line 106. After forming the interconnect via 104, an anneal process is performed. The anneal process eliminates interfaces between the interconnect via 104 and the second conductive line 106, improving electrical resistance of the second conductive line 106.

Similarly, as described in reference to FIGS. 9A and 9B, the third dielectric layer 808 may be a sacrificial material or a non-sacrificial material. For instance if the third dielectric layer 808 used in FIGS. 9A and 9B is a sacrificial material, the third dielectric layer 808 needs to be replaced with a non-sacrificial dielectric material after forming the interconnect via 104. In one embodiment of the disclosure, the third dielectric layer 808 is may be a dielectric material with an ultra-low dielectric constant.

In the above detailed description, a method for fabricating interconnect structures is presented. A via opening is formed in a conductive line and connecting the conductive line to an underlying conductive line. The via opening is filled with a conductive material to form an interconnect via. An upper portion of the interconnect via forms a portion of the conductive line. The method presented is suitable for conductive materials can be easily patterned using conventional plasma etching process, but challenging to remove using conventional CMP process. The method disclosed also provides a desired self-aligned interconnect via structure to an above and an underlying conductive line.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A method of fabricating an interconnect structure of a semiconductor device, the method comprising:
forming a first dielectric layer over a first conductive line;
forming a second conductive line over the first dielectric layer;
forming a second dielectric layer over the first dielectric layer and adjacent to the second conductive line;
forming a via opening through the second conductive line, wherein the via opening is aligned over the first conductive line and has a width equal to a width of the second conductive line;
removing a portion of the first dielectric layer beneath the via opening to extend the via opening to an upper surface of the first conductive line before filling the via opening with a conductive material to form an interconnect via, wherein extending of the via opening to the upper surface of the first conductive line comprises an etching process, wherein the first dielectric layer and the second dielectric layer are etched by the etching process, wherein the second dielectric layer etches slower than the first dielectric layer during the etching process; and filling the via opening with the conductive material to form the interconnect via, wherein an upper portion of the interconnect via forms a portion of the second conductive line.

2. The method of claim 1, wherein removing the portion of the first dielectric layer, further comprises:

removing additional portions of the first dielectric layer from areas on both sides of the first conductive line to a level less than 10 nm below the upper surface of the first conductive line.

3. The method of claim 1, wherein forming the interconnect via, further comprises:

recessing the first conductive line;

depositing an etch stop layer between the recessed first conductive line and the first dielectric layer;

removing a portion of the first dielectric layer beneath the via opening to expose a portion of the etch stop layer; and removing the exposed portion of the etch stop layer to expose the first conductive line before filling the via opening with the conductive material to form the interconnect via.

4. The method of claim 1 wherein the interconnect via and the second conductive line are formed of different conductive materials.

5. The method of claim 1 wherein the interconnect via and the second conductive line are formed of the same conductive material.

6. The method of claim 1 wherein the second conductive line comprises a conductive material that can be etched by a plasma etching process.

7. The method of claim 1 wherein the second conductive line comprises Ru or Co.

8. The method of claim 1 wherein the interconnect via has a width at least as wide as the first conductive line.

9. The method of claim 1 wherein the interconnect via comprises Co.

\* \* \* \* \*